United States Patent [19]

Tabata et al.

[11] 4,310,567
[45] Jan. 12, 1982

[54] METHOD FOR CHEMICAL VAPOR DEPOSITION

[75] Inventors: Osamu Tabata, Ikeda; Mitoshi Waseda, Moriyama, both of Japan

[73] Assignees: Agency of Industrial Science & Technology, Tokyo; Chugoku Marine Paints, Ltd., Hiroshima, both of Japan

[21] Appl. No.: 123,258

[22] Filed: Feb. 20, 1980

Related U.S. Application Data

[63] Continuation-in-part of Ser. No. 928,369, Jul. 27, 1978, abandoned.

[30] Foreign Application Priority Data

Aug. 2, 1977 [JP] Japan ................................. 52-93291

[51] Int. Cl.³ .................... B05D 5/12; B05D 1/00; C03C 17/00; C23C 13/04
[52] U.S. Cl. ........................................ 427/82; 148/6.3; 148/6.35; 427/91; 427/94; 427/95; 427/109; 427/124; 427/126.2; 427/126.3; 427/126.4; 427/126.6; 427/164; 427/166; 427/167; 427/250; 427/252; 427/253; 427/255; 427/255.1; 427/255.2; 427/255.3
[58] Field of Search .................. 148/6.3, 6.35; 427/82, 427/91, 94, 95, 109, 124, 126.2, 126.3, 126.4, 126.6, 164, 166, 167, 250, 252, 253, 255, 255.1, 255.2, 255.3

[56] References Cited

U.S. PATENT DOCUMENTS

| 3,148,084 | 9/1964 | Hill | 427/74 |
| 3,681,042 | 8/1972 | Edwards | 118/48 |
| 3,819,404 | 6/1974 | Scholes | 118/48 |
| 3,841,858 | 10/1974 | Akashi | 118/49 |
| 3,925,050 | 12/1975 | Kushihashi | 118/326 |
| 3,934,063 | 1/1976 | Dubble | 118/48 |
| 4,123,244 | 10/1978 | Leclercq | 118/326 |
| 4,125,391 | 11/1978 | Van Laethem | 118/49 |

OTHER PUBLICATIONS

Tabata et al., "Chemical Vapor Deposition by a Reflecting Gas Stream", International Conference on Solid Films and Surfaces, Collected Abstracts, Jul. 5-8, 1978, p. 1340.

Primary Examiner—James R. Hoffman
Attorney, Agent, or Firm—Armstrong, Nikaido, Marmelstein & Kubovcik

[57] ABSTRACT

A gas containing a film forming component is shot through a shooting means in the form of a high speed stream of gas. The gas stream is shot toward the surface of a heated base where a film is to be deposited. The stream is directed at an inclination relative to the base surface. As the stream approaches the base surface it is subjected to the action of a high speed sucking stream of air produced by a sucking means. The sucking means causes the gas stream to flow in a V-shaped path with the upper ends of the V located at the shooting means and the sucking means, with the vertex of the V located therebetween. The film coating is placed on the surface of the base by allowing the base surface to contact the V-shaped path of the stream at the vertex of the path.

10 Claims, 6 Drawing Figures

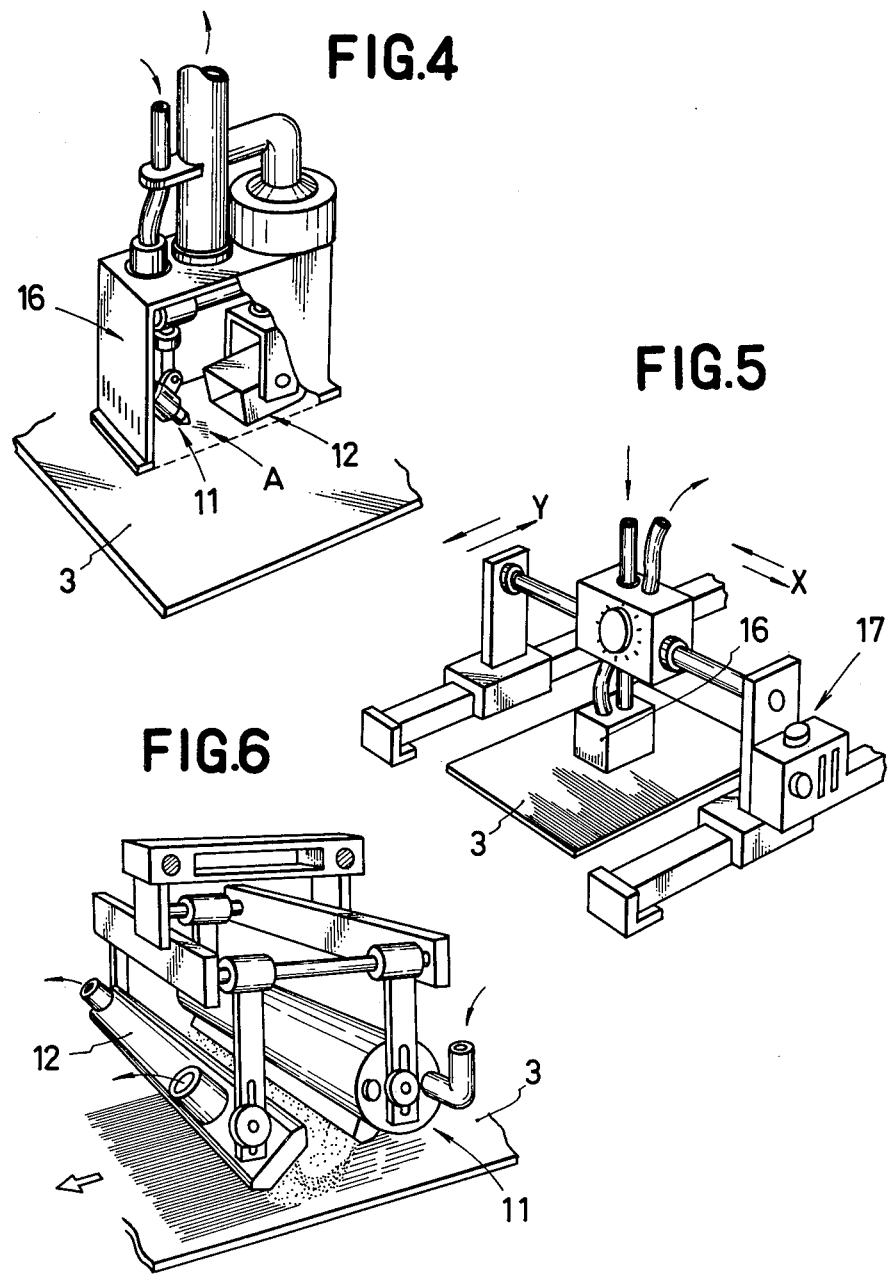

METHOD FOR CHEMICAL VAPOR DEPOSITION

This application is a continuation-in-part of Ser. No. 928,369, filed July 27, 1978 and now abandoned.

BACKGROUND OF THE INVENTION

(1) Field of the Invention

The present invention relates to a method and apparatus for forming a film coating on the surface of a base. More specifically, the present invention relates to an improved method and apparatus for forming a clear transparent electrically conductive film or a clear transparent insulated coating on the surface of a base.

(2) Description of the Prior Art

The prior art has disclosed methods for forming coatings or foils made of stannic oxide, indium oxide, or foils and coatings of similar materials. One of the methods disclosed within the prior art is a vacuum vapor deposition method. The vacuum vapor deposition method known in the prior art cannot be applied continuously and onto a wide area due to the fact that the vacuum vapor deposition system must be a closed system. The coatings obtained by the vapor deposition according to the prior art are not only expensive but small and are limited in their use within the electronics field, optical field, and/or other fields where such coatings are useful.

In light of the limitations of the prior art vacuum deposition method as pointed out above, there has existed a need for a coating having excellent light transmittance comparable with one obtained by vacuum vapor deposition and also having excellent crystallinity, thermal stability, weather proofing property, chemical proofing property, adhesion power and mechanical strength. The prior art is also lacking in that it is not capable of producing a coating having the qualities as described above in a continuous manner onto a large base surface.

A method exists within the prior art for forming a coating spread on a wide area of a base surface. This method is a chemical method in which a gas containing a film forming component is sprayed onto a heated surface of a base sheet. However, according to this method, the thickness of the coating cannot be closely controlled. Furthermore, the resulting coating does not have a desirable surface uniformity. Furthermore, the surface of the coating formed according to this method has an undesirable appearance caused by an unavoidable white cloudiness in the coating. This white cloudiness damages the electro-optical properties and therefore this method is not utilized within the field of electronics.

SUMMARY OF THE INVENTION

The present is a method for continuously placing a uniform, transparent film onto the surface of a relatively large base, and an apparatus for performing this method. The method is carried out by placing reactive particle components within a gas. The gas containing these particles are compressed and shot out of a nozzle in a jet stream at an inclination towards the surface of a base to be coated. A powerful suction means is positioned opposite the nozzle. As gas is fired from the nozzle toward the surface of the base, the stream is caused to bend into a V-shaped path by the forces applied by the suction means. The suction means is directed toward the surface of the base to create a suction steam of air away from the surface of the base. Accordingly, a V-shaped stream is formed from the gas and particles which are directed out of the nozzle. The vertex of this stream is positioned precisely over the surface of the base to be coated. Thereby, the gas and particles within the stream shot from the nozzle are not generally directed against and reflected away from the surface of the base, but rather are passed over the surface of the base in close proximity to that surface.

By adjusting the angles of the jetting means and the suction means, the angle of the V-shaped stream which is formed can be changed. Furthermore, the precise positioning of the vertex of the stream can be adjusted by adjusting the pressure of the gas from the nozzle, the suction of the suction means or the positioning of either the nozzle or the suction means. By adjusting the angle of the V-shaped stream and the precise positioning of the vertex of the V-shaped stream, it is possible to position the surface of the base to be coated precisely at the edge of the vertex of the V-shaped stream. Accordingly, it is possible to achieve an extremely desirable coating on the surface of that base.

It is a primary object of the present invention to produce a coating on the surface of a heated base through a chemical reaction of a film forming component contained in the gas which is contacted with a heated base surface. The method is comprised of shooting the gas through a jetting means in the form of a high speed stream of gas and a velocity of 1–10 m/sec toward the base surface at an inclination of 20°–60° relative to the surface of the base. The gas-containing film forming components is comprised of particles of at least one film forming substance selected from the group consisting of an organometal compound and a metal halide. The gas is further comprised of at least one reaction gas selected from the group consisting of oxygen, hydrogen, ammonia and nitrogen, together with a carrier gas such as argon, nitrogen, and helium. The gas which is fired from the jetting means is subjected to the action of a high speed sucking stream of air prior to contacting the surface of the base. The sucking means is positioned downstream of the shot gas stream. The sucking stream of air is provided at a velocity of 1–10 m/sec and at a ratio of the sucking velocity of the sucking stream of air to the shooting velocity of a gas of 1.1 to 5.0. The sucking stream is provided in a manner such that a V-shaped bent path of flow of the gas is formed. The bottom of the gas flow path is a vertex which is positioned between the jetting means and the suction means. The stream being sucked away from above the surface of the base is turned upward at an angle of between 20° and 45°. The shot gas is allowed to contact the surface of the base at the bottom of the vertex of the V-shaped stream.

Another primary object of the present invention is to present an apparatus for producing a uniform film of a metal or metal compound over the surface of a heated base through a chemical reaction of a gas containing a film forming component which is contacted with the heated base surface. The apparatus is comprised of a jetting means for shooting a gas containing a film forming component in the form of a high speed stream toward the surface of the base at a velocity of 1–10 m/sec and at an angle of 20° to 60° relative to the base surface. The jetting means has a circular or slit-like jetting opening having an area not exceeding 33 cm². The apparatus is further comprised of a sucking means for producing a high speed sucking stream of air at a velocity of 1–10 m/sec wherein the ratio of the sucking velocity of the sucking air stream to the shooting velocity of the gas jet stream is 1.1 to 5.0. Said sucking means is capable of forming a V-shaped path out of the flow of gas which is fired from the jetting means. The area of the opening of the suction means being greater than the area of the opening of the jetting means. The opening of the sucking means has an area within the range of $4 \times 4$ cm$^2$ to $15 \times 15$ cm$^2$ wherein the area of the opening of the jetting means has a circular opening or a slit-like opening being $1.5 \times 5$ cm$^2$. The apparatus is further comprised of a support for the base capable of holding the base at the vertex of the V-shaped path. Furthermore, the apparatus is comprised of a means for heating the base.

Another object of the present invention is to present a method wherein a film is deposited on the surface of the base by contacting the surface of the base with the vertex of a V-shaped stream containing film forming component particles such that the particles do not strike against and reflect off the surface, but rather come into contact with it.

Another object of the present invention is to provide an apparatus which is capable of directing a stream of gas and particles outward and of diverting that stream by a sucking means so as to form a V-shaped path, the vertex which can be brought into contact with the uppermost surface of a base to be coated such that the edge of the V-shaped stream of gas skims across and does not hit against and reflect from the surface of the base to be coated.

Another object of the present invention is to prevent the occurrence of a white cloudiness which damages the appearance of coatings obtained in chemical vapor deposition of electrically conductive or insulated coatings.

Another object of the present invention is to provide a novel method and apparatus for chemical vapor deposition which is capable of continuously producing a uniform, cloud-free, large, transparent coating.

A further object of the present invention is to provide a method of and apparatus for manufacturing continuously, in the air, coatings for substrates which can be used as electrically conductive bodies, semi-conductive bodies, or non-conductive bodies, said coatings being comprised of an element or a compound having excellent properties in comparison with corresponding coatings manufactured by vacuum vapor deposition.

These and other objects and advantages of the present invention will become apparent to those persons skilled in the art upon reading the details of construction and usage as more fully set forth below. Reference being made to the accompanying drawings forming a part hereof wherein like numerals refer to like parts throughout.

The objects mentioned above are achieved by adopting the following steps in a method for forming a coating in which at least one film forming component is directed to a heated base to carry out a chemical reaction: Firstly, a gas containing the film forming component is shot out from an inclined direction through a jet means toward a portion of the heated base to be coated; secondly, as the inclined gas stream approaches the surface of the heated base, the stream is acted upon by a high speed stream of air generated by a sucking means which is positioned opposite and downstream from the jet means, the stream is caused to turn its path to flow upward in a manner such that the stream forms a V-shaped path of flow of gas between the jetting means and the sucking means, with the vertex of the V being positioned over the surface of the base. The film coating is placed on the surface of the base by letting the surface of the heated base lightly touch the vertex of the gas so that a film forming component barely contacts the surface of the base and forms a film thereon.

Furthermore, the above-mentioned objects are achieved by adopting the above-described method in an apparatus for forming a coating by which at least one film forming component is sent to a heated base to carry out a chemical reaction. The apparatus is comprised of a jet means, a sucking means, and a base support surface which may include a heating means. The jet means is capable of shooting out a gas containing a film forming component in an inclined direction toward the portion of the heated base which is to be coated. The suction means is positioned so that it redirects the gas stream and turns its direction being touching the surface of the base.

BRIEF DESCRIPTION OF THE DRAWINGS

FIG. 4 is a schematic view of the apparatus of the present invention which is suitable for forming a spotted coating;

FIG. 5 is a schematic view of an apparatus of the present invention in which a jet means and a turning over means (or suction means) can be moved in two dimensions; and FIG. 6 is a schematic view of an apparatus of the present invention which has a jet means having a slit opening.

DESCRIPTION OF THE PREFERRED EMBODIMENTS

Before the present method and apparatus for chemical vapor deposition is described, it is to be understood that this invention is not limited to the particular arrangement of parts or steps shown and described, as such methods and devices may vary. It is also to be understood that the terminology used herein is for the purpose of describing particular embodiments and methods only, and is not intended to be limiting since the scope of the present invention will be limited only by the appended claims.

The principle of the present invention will be described with reference to FIG. 1 of the drawings.

Figure 1:
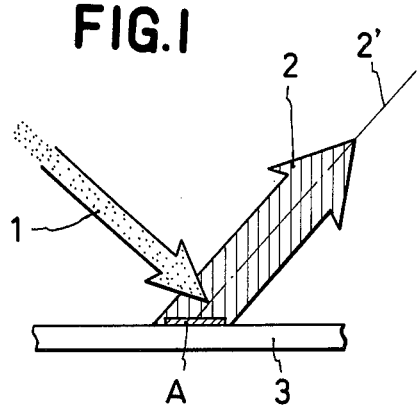
FIG. 1 is a conceptional view for explaining principles of the gas deposition process.
Figure 2:
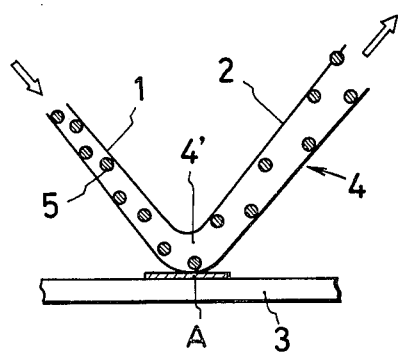
FIG. 2 is a conceptional view for explaining principles of the gas deposition process showing the V-shaped stream having its vertex in contact with the surface of a base to be coated.

In FIG. 1, a gas 1 containing at least one film forming component is shot out of a jet means (not shown). The gas stream is directed toward a portion A of the surface of a base 3 to be coated. As the gas stream approaches the portion A of the base 3, it is subjected to a suction stream which is pulling in an upward direction away from the base 3. The upward direction of the suction stream is designated by the center of the arrow 2'. The suction stream then causes the gas stream to be bent upward in a V-shaped path. The V-shaped path is formed between the jet means and the suction means with the vertex being formed at the position A on the substrate 3 as shown within FIG. 2. The film forming components within the gas stream shown within FIG. 2 are therefore redirected from their direction as shown by the arrow on the left side of FIG. 1, so that they are then following in the direction of the arrow 2, shown on the right side of FIG. 1. The angle of the gas stream being directed toward the base, with respect to the base 3, may be equal to the angle of the arrow 2' with respect to the base 3. Accordingly, if gas approaches the base 3 at an angle of 45° when the gas is subjected to the suction forces, it turns upward and the gas flows away from the base 3 at an angle of 45° with respect to the base 3.

The gas and particles 1 which are not deposited on the portion A of the base 3 are sucked within the suction means (not shown). The continual flow of the gas and particles shot out of the jet means (not shown) is then turned upwardly by the suction means (not shown) which causes the gas stream to form a V-shaped path 4 as shown within FIG. 2. The V-shaped path 4 is comprised of high speed gas flow from the jet means to the suction means having a bend region 4' which is positioned approximately mid-way between the jet means and the suction means. The bend region 4', of course, forms the vertex of the V-shaped path 4.

The bottom portion of the vertex of the V-shaped path is brought into contact with the top surface of the portion A to be coated. A heating means (not shown) heats the base 3 and the portion A to be coated. Accordingly, the film forming component particles 1 in the gas undergo a chemical reaction and become deposited on the base 3 as they pass over the surface of the portion A to be coated.

Figure 3:
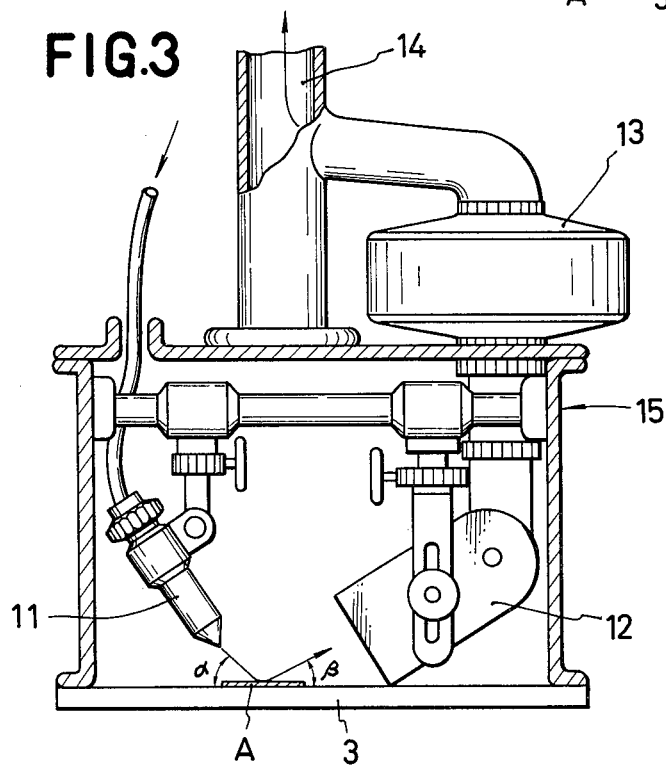
FIG. 3 is a side view of a typical apparatus of the present invention.

The method of the present invention can be described in details by referring to FIGS. 1, 2 and 3. A gas containing at least one type of reactive gas component particle 5 as shown within FIG. 2 is heated. The particle 5 may be allowed to react with other components or particles contained within the gas or may be comprised so as to react only with the surface which it is to be directed against. After the gas and the reactive gas component particles are heated, the gas is pressurized. The pressurized gas is fired from a nozzle such as the nozzle 11 shown within FIG. 3. The stream of gas is directed towards a portion of a surface A on a base 3. The gas is directed at an angle alpha with respect to the surface of the base 3.

A powerful suction means such as the suction means 12 is positioned downstream of the gas which is fired from the nozzle 11. The suction means 12 creates a strong air flow away from a limited space somewhat higher than the surface of the portion A, wherein the shot gas stream is effectively bent. The air flow then leaves from the height of the limited space above the surface of the portion A at an angle beta which may be equal to the angle alpha at which the gas is being directed toward the surface of the base 3. The nozzle 11, suction means 12, and pressure and speed of the gas are adjusted such that the flow of gas bends upwardly precisely, being touching the surface of the portion A to be coated. Therefore, the surface of the portion A to be coated is positioned at the vertex of a V-shaped stream of gas.

The coating is formed on the surface of the portion A by the particles coming into contact with that surface. The particles and gas do not collide against and reflect from the surface.

If the gas contains low speed reactive gas particle components, these components may undergo reaction before reaching the surface of the portion A to be coated. If the particles do undergo a reaction, they will produce a fine powder within the stream which is directed towards the surface to be coated. However, this fine powder will be removed to the upper portion of the stream prior to reaching the surface A to be coated. Therefore, none of the powder will come in contact with the surface to be coated but will be drawn away into the suction means 12. The fine powder will be removed and not allowed to contact the surface due to the fact that they are the lower speed particles within the stream.

As pointed out above, the slower moving particles react and turn to a fine powder. In prior art methods, this fine powder often appears in the film coating as a white cloudiness. However, when a coating is formed according to the present process the fine powder particles are removed to the upper portion of the stream and sucked away by the sucking means. Accordingly, the coating layer is continually formed by the high speed particles which are capable of forming a uniform, continuous, transparent coating. Thus, the present method eliminates the white muddiness present in the coatings provided by prior art methods. The white muddiness appears on the coatings produced according to the prior art methods due to the fact that all the particles are directed against the surface of the base to be coated. When all of the particles strike the surface to the coated, the smaller particles which have turned to white powder, stick within the transparent coating being formed.

In the present invention, plates or sheets such as glass, ceramics, semi-conductor and metal plate may be used as the base. Curved plates having a large curvature radius of 50 cm can be used.

For the coating or film components, elements such as Au, C, Ag, Cu, Al, Nb, Ge, Ni, W, Mo, Cr, Ta, Sb, Si, In, Ga and Ti and compounds, for example, metal oxides and nitrides such as $SnO_2$, $Sb_2O_3$, $In_2O_3$, $ZrO_2$, $TiO_2$, $SiO_2$, $Al_2O_3$, $Si_3N_4$, $Fe_2O_3$, $Cr_2O_3$, $ZnO$, $V_2O_5$ and $MnO_2$ may be used. Preferable combinations of the base and the coating component in the present invention are combinations of glass, ceramics, silicon or metal with $In_2O_3$, $TiO_2$, $V_2O_5$, $SiO_2$, $ZnO$, $Fe_2O_3$, $Si_3N_4$, $Ga_5As_3$, $Ga_5P_3$, Si or C.

The chemical reactions for forming the coating are conventional film-forming reactions such as carbonizing reaction, oxidizing reaction, reducing reaction, nitriding reaction, thermal-decomposition reaction, disproportionation reaction, proportionation reaction or the like.

As the film-forming components for forming the coating utilizing the above reaction, elements such as Zn and In, inorganic metal halides such as $SnF_2$, $TiCl_4$, $GaCl_2$, $AsCl_3$, phosphorus compounds, arsenic compounds, hydrogen compounds such as $SiH_4$, and organic metal compounds such as $(CH_3)SnCl_2$, $Sn(HCOO)_2$, $Al(OCH_3)_3$ are preferably used.

Such a raw material may be blended with oxygen, hydrogen, ammonia, nitrogen or the like according to the selected reaction and shot out by means of the jet means such as a nozzle toward the base. Inert gas or oxygen may be accompanied as carrier gas in order to carry out the reaction smoothly.

The apparatus for practicing the present invention has the jet means 11 and the suction means 12 and they are disposed in an arrangement opposite to each other or facing each other and they are individually inclined to the base. The angle, speed, and volume of material flowing from the jet means 11 may be individually adjusted or may be the angle and suction force of sucking means 12.

In FIG. 3, the angle of the jet means is shown as shooting angle α and the angle of the suction means is as turning angle β.

The deposition place on which to form a coating is shown as A. The reference characters 13, 14 and 15 show, respectively, a high-speed exhaust fan, an exhaust means and a casing.

The situation and the angle of the jet means and the suction means are important.

When the jet means and the suction means are arranged at suitable angle and intervals, the leaving velocity of the reactive gas flow at the deposition place is remarkably large as compared with the high speed turned gas stream generated by means of the suction means 12. Therefore, the staying time of the reactive gas in the region of turning of the gas stream at the base is remarkably shortened. As a result, the space reaction which is the direct cause of white muddiness is prevented.

The velocity of the reactive gas shot from the jet means or the shot gas velocity and the velocity of the turned gas stream sucked by the suction means are preferably at least 1 m/second. The upper limit thereof is not critical but it may normally be up to about 10 m/second. The optimum velocity may be determined from considering the temperature drop of the base because the gas stream bent or turned by the suction means absorbs a considerably large amount of heat from the base. Usually, the preferable gas velocity is, as mentioned above, 1–10 m/second, and more preferably, 1–5 m/second. Within the above velocity range, the shot gas velocity and the turned gas velocity can be changed independent of each other. In this case, the course of the reactive gas shot from the jet means changes according to the ratio of both gas velocities ($\gamma$ = the velocity of the turned gas stream/the velocity of the shot gas stream).

The turned gas stream which is the means for vapor deposition in the present invention may be prepared by suitably adjusting both gas velocities to optional shooting angle and turning angle so as to contact with the base. Actually, the shooting angle α may be determined according to the ratio of front and rear scatterings of the reactive gas stream touching the base surface ($\tau$ = the rear scattering distance of the collided gas/the front scattering distance thereof). The shooting angle in the present invention is preferably 20°–60° and, more preferably, 30°–50°.

The turning angle of the suction means β may be determined considering the actual angle of the gas turned on the base. In the present invention, the turning angle is preferably 10°–45° and, more preferably, 20°–40°.

The ratio of the gas velocities $\gamma$ is preferably 1.1–5.0 and, more preferably, 1.4–3.

The height of the jet means is usually 1–20 cm, preferably 2–10 cm from the base surface. The height of the lower end of the opening of the suction means is usually 0.5–5 cm, preferably 0.7–3 cm, from the base surface.

The opening of the jet means may be either round or slit-like, and its cross-sectional area may preferably be as small as possible, not exceeding 33 cm$^2$ and, more preferably, smaller than 8 cm$^2$, for example.

Regarding the opening of the jet means, its sectional area may be within the range of from 4 cm×4 cm to 15 cm×15 cm when the opening of the jet means is a round one, and when the jet means has a slit-like opening, it may be (the length of the slit×1.5) cm×5 cm.

The apparatus of the present invention is equipped with a suitable driving means so as to move two-dimensionally.

According to the present invention, a clear coating having excellent optical properties can be deposited on the base and, optionally, a pattern coating can be deposited.

The vapor deposition of the present invention is such a one which relies on a high-speed gas flow and a highly localized coating zone so that it is feasible to prevent any parts on the base surface other than those to be vapor deposited from being polluted with the flow of reaction-accomplished gas containing white-muddling powder, and at the same time, carry out the deposition free of an influence depending on environmental conditions.

According to the present invention, even in the air, an excellent coating comparable with vacuum technique can be obtained, and not only transparent electrically conductive coatings such as SnO$_2$ coating and In$_2$O$_3$ coating, but also various useful transparent or opaque coatings of metals or compounds can be obtained.

EXAMPLE 1

This Example is to make clear the effects of a coating head for forming spotted coating.

FIG. 4 is a schematic view of the spot coating head for a transparent electrically conductive coating of SnO$_2$. The coating head 16 is set on the base of a glass plate 3. The glass plate is previously heated at 550° C. on a heated plate (not shown). The lower end of a suction pipe 12 is adjusted to be 5–10 mm high from the base surface 3. The shooting opening of a reaction gas pipe 11 is set 20–50 mm in height from the base surface 3 and the axes of both means are directed toward a deposition place A. The angle between the jet pipe 12 and the base surface 3 is adjusted at 45°. The turning angle of the suction pipe 12 to the base surface 3 is adjusted at 30°.

Firstly, the suction pipe 12 is driven to make a high speed sucking stream of air to bend the shot gas stream upward, rising from above the deposition spot A. Since the angle of the suction pipe 12 is 30°, the rising angle of the stream is also 30°. Setting up the sucking stream to bend the shot gas stream upward is essential in the present invention to produce white-muddiness-free coating.

Then, by means of a reaction gas generator (not shown) a gas of stannic dimethyldichloride [CH$_3$)$_2$SnCl$_2$] is generated and a mixed gas of this gas and oxygen (1:1) is shot, as a high-speed gas beam together with carrier gas such as Ar or N$_2$, or dry air, by means of the jet pipe 11 to be rushed toward the deposition spot A, only where the V-shaped gas stream contacts the base surface 3. On the predetermined deposition spot, transparent spotted electrically conductive coating of SnO$_2$ is formed. The diameter of the circular or elliptic spot is 5–30 mm. The coating thus obtained has no white muddiness or optical disadvantage both of which have not been solved by conventional methods.

Table 1 shows the effects of the present invention in comparison with conventional methods. In the Table, "degree of muddiness" is an average value of each 10 pieces of test plates to a cleaned glass plate.

The degree of muddiness in the present invention, 7%, is inferior to 5% in the vacuum vapor deposition, but the coating thickness in the present invention is about 1.5 times as thick as the vacuum vapor deposition film and therefore it is clear that the optical properties of the spotted coating of the present invention is better.

TABLE 1

|  | Vacuum Vapor Deposition | Present Invention | Conventional Chemical Deposition (1) | Conventional Chemical Deposition (2) |
|---|---|---|---|---|
| Degree of Muddiness % | 5 | 7 | 16 | 28 |
| Thickness of Film (Å) | 2300 | 3500 | 3400 | 3550 |
| Notes |  |  |  | No Suction Pipe |

EXAMPLE 2

This Example shows that the spot coating head used in Example 1 is equipped with an optional two-dimensional driving means and unique, muddiness-free, large plane area deposition or partial deposition or pattern deposition can be conducted. FIG. 5 is a schematic view of a main pair of an apparatus. The spot coating head 16 is driven at optional speed toward the deposition region by means of an X-Y axis driving means 17. To continuously conduct a large-area deposition, the base plate 3 is moved at constant speed toward one direction and the spot coating head is subjected to reciprocating motion so as to traverse the base at a high speed. The suitable diameter of a spot is 5 mm, the suitable base plate moving speed is 1 m/minute and the suitable spot traversing frequency is 200 times/minute. The spot traversing length or the width of the glass plate of the base is 20 cm, and under these conditions, transparent electrically conductive $SnO_2$ coating of 2600 Å in thickness is obtained.

The uniformity of coating thickness is 5–10% caused by uneven effect of heating of the glass plate.

EXAMPLE 3

In order to avoid the high speed motion of the spot coating head used in Example 2 when manufacturing uniform large area plane film, it is preferable to use horizontally arrange plural jet pipes and plural suction pipes, respectively, in an assembled body, or, as shown in FIG. 6, to use a jet pipe having a long and narrow shooting opening 11 and a suction pipe having a long and narrow opening 12. In the case of FIG. 6, the reaction gas is shot from the long and narrow jet tube 11 in the form of thin plate and turned over to make line deposition. The length of the opening of the jet pipe is adjusted to the width of the base. The coating head is set on the stand for moving the base used in Example 2 and $SnO_2$ is continuously deposited on a glass plate of 300 mm × 300 mm at 1-2 mm/minute of the base moving speed to obtain transparent, muddiness-free, uniform, electrically conductive coating.

Example 4

In this invention, the velocity of V-shaped gas stream plays an important role in eliminating muddiness or haze. The gas velocity at least exceeding 1 m/second, which is determined at the turning point, is preferable.

This velocity condition was clearly turned out during the process of preparing $In_2O_3$ film doped with $SnO_2$ using a reactive gas composed of $InCl_3$, $SnCl_4$, and air, under the following conditions:

Nozzle opening, 2 mm in diameter;
sucker opening, 5 cm × 5 cm;
nozzle angle, 50°;
sucker angle, 40°;
height of the nozzle, 4 cm; and
height of the sucker, 2 cm.

$In_2O_3 \cdot SnO_2$ transparent conductive films are deposited in a round pattern of 3 cm in diameter using a V-shaped reactive gas stream of the velocities from 0.1 m/sec. to 12 m/sec. at the turning point, while maintaining the velocity ratio of shot gas stream and sucking gas stream at a constant value of 1.5. The thickness of the deposited films ranges from 2500 to 3000 Å.

The relationship found between haze and the velocity of the V-shaped gas stream is as illustrated in Table 2 below:

TABLE 2

| Gas Velocity (m/sec.) | Haze Factor (%) |
|---|---|
| 0.1 | 18.5 |
| 0.2 | 6.3 |
| 0.4 | 4.0 |
| 0.6 | 1.6 |
| 0.8 | 1.3 |
| 1.0 | 0.91 |
| 2.0 | 0.80 |
| 4.0 | 0.77 |
| 6.0 | 0.76 |
| 8.0 | 0.81 |
| 10.0 | 0.75 |
| 12.0 | 0.79 |

The haze factor is defined as the ratio of scattered light by the film to the incident light and was measured according to JIS K-6714.

EXAMPLE 5

In this invention, it is essentially important, as well as the velocity of the reactive gas, that both nozzle and sucker are set at an optimum angle so as to normally generate a V-shaped gas stream from the nozzle to the sucker opening, bent at the deposition point.

Transparent conductive $SnO_2$ films have been prepared on glass plates by letting them touch an Ar high-speed V-shaped gas stream containing such reactive gases as $SnCl_4$, $SbCl_3$, and $O_2$. In this process, the effective combination of a range of nozzle angles and a range of sucker angles for haze elimination has been found.

Firstly, the position and the angle of the nozzle are changed from right above the glass surface to a position 5 cm high just above the turning point along the circle of the radius 5 cm of which center is located at the turning point and film deposition is carried out, while the sucker is fixed at a position 1 cm high above the glass surface at the downward angle of 30°.

Secondly, the position and the angle of the sucker are changed in the same way as above while the nozzle angle is retained 40° and its height about 3.2 cm and again film deposition is carried out.

The nozzle has a shooting slit of 10 cm × 0.5 mm in dimension and the sucker has an opening of 20 cm × 5 cm in dimension.

The shot gas velocity is about 2 m/sec. and the sucking velocity is about 3 m/sec. Thus, the velocity ratio of gas streams becomes 1.5 which is an optimum value for producing a V-shaped gas stream.

Under the above conditions, 6 cm×6 cm large glass plates which are heated at 550° C. are successively passed over the turning point of the V-shaped reactive gas stream at a rate of about 2 m/min., and about 3000 Å thick films are deposited.

The haze factor of the films was measured by the method of JIS-K6714 with the result as shown in the following Table 3:

TABLE 3

| Angle (°) | Nozzle Angle ($\alpha$) | Sucker Angle ($\beta$) |
| --- | --- | --- |
| 0 | 7.0 | 33 |
| 10 | 3.1 | 1.3 |
| 20 | 1.2 | 0.92 |
| 30 | 0.79 | 0.82 |
| 40 | 0.84 | 0.86 |
| 50 | 0.82 | 1.1 |
| 60 | 1.4 | 1.8 |
| 70 | 4.7 | 3.5 |
| 80 | 12.5 | 9.4 |
| 90 | 21.3 | 24.0 |

Apparently, haze vanishes in an optimum range of 30°–50° for the shooting angle and a range of 20°–40° for the sucking angle.

EXAMPLE 6

The present invention also has succeeded in preparing a number of films of metals, oxides, carbides, nitrides and so on. Some of them are shown in the following.

EXAMPLE 6-1

Si Film

Thick films of Si, about 3.5$\mu$ thick, have been obtained by using a reactive V-shaped gas stream composed of $SiCl_4$, $H_2$ Ar gases or $HSiCl_3$, $H_2$ and Ar gases, on both alumina and graphite plates at 900° C. after 10 minute reaction, under conditions as follows:

Nozzle opening, 10 cm×0.5 mm;
sucker opening, 20 cm×5 cm;
nozzle angle, 40°;
sucker angle, 30°;
nozzle height, 5 cm;
sucker height, 1.5 cm;
gas velocity, 2–3 m/sec.;
velocity ratio of the gases, ~2; and
toal gas flow, 6–10 lit./min.

Due to using the hydrogen reduction of metal halide in air, it was particularly required to entirely envelope the reactive V-shaped gas stream from the nozzle to the sucker through the deposition point with an Ar down flow falling at rates of 0.10–3 m/sec.

EXAMPLE 6-2

$SiO_2$ Film

The $SiO_2$ film was readily obtained by replacing the reactive gas component $H_2$ by $O_2$ without the Ar down flow in the case of Example 6-1 above. The film thickness grew to 2$\mu$ after 5 min. deposition.

EXAMPLE 6-3

SiC Film

SiC films were also obtained by using the reactive gas system of $CH_3SiCl_3+H_2+Ar$ under the same conditions as in Example 6-1. Around 3.4$\mu$ thick SiC layers were deposited on each of alumina and graphite plates at 1050° C. after 15 minutes.

EXAMPLE 6-4

W Film

The deposition of tungsten films was successfully carried out at 600° C. using the reactive V-shape high-speed gas stream consisting of $WC_6$, $H_2$ and Ar under conditions similar to Example 6-1, except for the reaction temperature of 900° C. About 3–5$\mu$ thick W films were obtained to Si-wafers, graphite and stainless steel plates after several minutes.

EXAMPLE 6-5

Ti Film

Titanium film deposition has been carried out using the $TiCl_4$, $H_2$ and Ar gas system under conditions similar to those in Example 6-1. Ti films were deposited to 4.3$\mu$ in thickness on graphite plates at 1000° C. after 6 minutes.

EXAMPLE 6-6

TiN Film

TiN films were also deposited on graphite at 1100° C. under conditions similar to those in Example 6-1. The film thickness found is about 6$\mu$ after 5 minutes.

EXAMPLE 6-7

Al Film

Al films have been prepared on stainless steel plates at a low temperature of 700° C. using a 10 lit./min. V-shape high-speed gas stream mixed with $AlCl_3$, $H_2$ and Ar under conditions similar to those in Example 6-1. A deposition thickness of 3$\mu$ was attained after 4 minutes.

EXAMPLE 6-8

Cu Film

Cu films were also deposited on stainless steel by a continuous exposure to a reactive V-shaped gas stream of $Cu_3Cl_3$, $H_2$ and $N_2$ at 800° C. under conditions similar to those in Example 6-1. The film thickness found is about 5$\mu$ after 7 minutes.

The instant invention has been shown and described herein in what is considered to be the most practical, and preferred, embodiments. It is recognized, however, that departures may be made therefrom which are within the scope of the invention, and that obvious modifications will occur to one skilled in the art.

We claim:

1. A method of producing a coating on the surface of a heated base through a chemical reaction of a film forming component contained in a gas contacted with the heated base surface, which comprises:

forming a high-velocity, V-shaped stream of a gas containing a film forming component comprising particles of at least one film forming substance selected from the group consisting of an organometal compound and a metal halide, at least one reaction gas selected from the group consisting of oxygen, hydrogen, ammonia and nitrogen, and a carrier gas by shooting said gas through a jetting means in the form of a high speed stream of gas at a velocity of 1–10 m/sec toward a base surface at an inclination of 20°–60° relative to the base surface and subjecting the shot gas before it contacts the base surface to the action of a high speed sucking stream of air produced by a suction means disposed downstream from said jetting means in the path of the flow of the gas, said sucking stream having a velocity of 1-10 m/sec; the ratio of the sucking velocity of the sucking stream of air to the shooting velocity of the gas being from 1.1 to 5.0; said V-shaped stream of gas having a bottom point vertex zone at an intermediate portion between said jetting means and said suction means and having a portion turned upward at an angle of 20°-45° relative to the base surface, and contacting the heated base surface at said bottom point vertex zone of the bent flow path thereby causing formation of a coating on the base with the film forming component.

2. Method according to claim 1, in which the base is a plate selected from the group consisting of a glass plate, ceramic plate, semi-conductor plate and metal plate.

3. Method according to claim 1, in which the base is in the shape of plane plate or curved plate having a curvature radius of more than 5 cm.

4. Method according to claim 1, in which the coating is a transparent coating.

5. Method according to claim 1, in which the coating is an electrically conductive coating.

6. Method according to claim 1, in which the coating is an insulation coating.

7. Method according to claim 1, in which the film-forming component is selected from the group consisting of $In_2O_3$, $ZrO_2$, $TiO_2$, $SiO_2$, $Al_2O_3$, $SiN_4$, $Fe_2O_3$, $Cr_2O_3$, $ZnO$, $V_2O_5$, and $MnO_2$.

8. Method according to claim 1, in which the organo-metal compound is alkyl halogenated tin.

9. Method according to claim 1, in which the metal halide is metal chloride.

10. A method of producing a coating on the surface of a heated base through a chemical reaction of a film forming component contained in a gas contacted with the heated base surface, and which comprises:

forming a V-shaped stream of a gas containing a film forming component by shooting the gas through a jetting means toward a heated base surface and simultaneously subjecting the shot gas to the action of a high-speed sucking stream, said V-shaped stream of gas having a bottom point vertex zone, and contacting the heated base surface with the gas at the bottom point vertex zone, thereby causing formation of a coating on the base with the film-forming component.

* * * * *